US010684311B2

(12) United States Patent
Mende et al.

(10) Patent No.: US 10,684,311 B2
(45) Date of Patent: Jun. 16, 2020

(54) HIGH INPUT IMPEDANCE ELECTRO-OPTIC SENSOR

(71) Applicant: Tektronix, Inc., Beaverton, OR (US)

(72) Inventors: Michael J. Mende, Portland, OR (US); Richard A. Booman, Lake Oswego, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 15/948,163

(22) Filed: Apr. 9, 2018

(65) Prior Publication Data

US 2018/0328964 A1 Nov. 15, 2018

Related U.S. Application Data

(60) Provisional application No. 62/504,327, filed on May 10, 2017.

(51) Int. Cl.
*G01R 13/34* (2006.01)
*G01R 15/24* (2006.01)
*G01R 1/067* (2006.01)

(52) U.S. Cl.
CPC ....... *G01R 13/347* (2013.01); *G01R 1/06788* (2013.01); *G01R 15/241* (2013.01)

(58) Field of Classification Search
CPC .................................................. G01R 13/347
See application file for complete search history.

(56) References Cited

U.S. PATENT DOCUMENTS

| 5,969,341 A | 10/1999 | Ito et al. | |
| 6,392,779 B1 * | 5/2002 | Iannelli | G02F 1/0123 |
| | | | 359/237 |
| 2002/0061034 A1 * | 5/2002 | Schneider | G02F 1/0123 |
| | | | 372/26 |
| 2002/0167711 A1 * | 11/2002 | Nespola | G02F 1/0356 |
| | | | 359/245 |
| 2014/0015541 A1 * | 1/2014 | Sakai | G01R 29/0871 |
| | | | 324/537 |

FOREIGN PATENT DOCUMENTS

| EP | 2889683 | 7/2015 |
| EP | 3098612 | 11/2016 |

OTHER PUBLICATIONS

European Patent Office, Extended European Search Report and Written Opinion for European Application 18171684.6, Nov. 10, 2018, 7 pages, Munich, Germany.

* cited by examiner

*Primary Examiner* — Jas A Sanghera
(74) *Attorney, Agent, or Firm* — Miller Nash Graham & Dunn; Andrew J. Harrington

(57) ABSTRACT

The disclosure includes an electro-optical sensor. The electro-optical sensor includes a test signal input to receive a test signal from a device under test (DUT). A bias circuit is employed to generate a bias signal. The electro-optical sensor also includes a Mach-Zehnder Modulator (MZM) that employs an optical input, an optical output, and a bias input. The MZM is configured to receive an optical carrier signal via the optical input. The MZM also receives both the test signal and the bias signal on the bias input. The MZM modulates the test signal from the bias input onto the optical carrier to generate an optical signal while operating in a mode selected by the bias signal. The MZM also outputs the optical signal over the optical output.

18 Claims, 6 Drawing Sheets

HIGH INPUT IMPEDANCE ELECTRO-OPTIC SENSOR

CROSS-REFERENCES TO RELATED APPLICATIONS

The present application claims benefit from U.S. Provisional Patent Application Ser. No. 62/504,327, filed May 10, 2017, and entitled "High Input Impedance Optical Sensor With Split Path Buffer Into Mach-Zehnder Bias Input," which is incorporated herein by reference as if reproduced in its entirety.

FIELD OF THE DISCLOSURE

This disclosure is directed to a system and methods for testing electrical signals, and, more particularly, to an electro-optical voltage probe with increased impedance for use in conjunction with an oscilloscope.

BACKGROUND

Test and measurement systems are designed to receive signals, sample the signals, and display the results. For example, a test and measurement system may be implemented to determine and display characteristics of signals occurring at a device under test (DUT). In some cases, the test and measurement system may be located remotely from the DUT. For example, some DUT signals may be altered by the presence of any electrical system in close proximity to the DUT. In such cases, the test and measurement system may be located remotely from the DUT to support electrical isolation of the DUT, which results in increased measurement accuracy. Such isolation may be accomplished by employing optical communication to provide the electrical isolation barrier. Isolated optical components present many design challenges. One such challenge is being able to operate these components with very little power. This is because employing independent power connections degrades the ability to properly isolate the measurement system from the DUT. Operating with a low power budget presents difficulties in employing high impedance, high bandwidth buffer/amplifiers in the isolated measurement system. The need for having this high impedance is to reduce signal loading of the measurement system on the DUT. Increasing the power of the signal in the isolated portion of the test and measurement system is impractical because such power increases may easily exceed the available power budget in a low power device.

Examples in the disclosure address these and other issues.

BRIEF DESCRIPTION OF THE DRAWINGS

Aspects, features and advantages of embodiments of the present disclosure will become apparent from the following description of embodiments in reference to the appended drawings in which.

DETAILED DESCRIPTION

Figure 1:
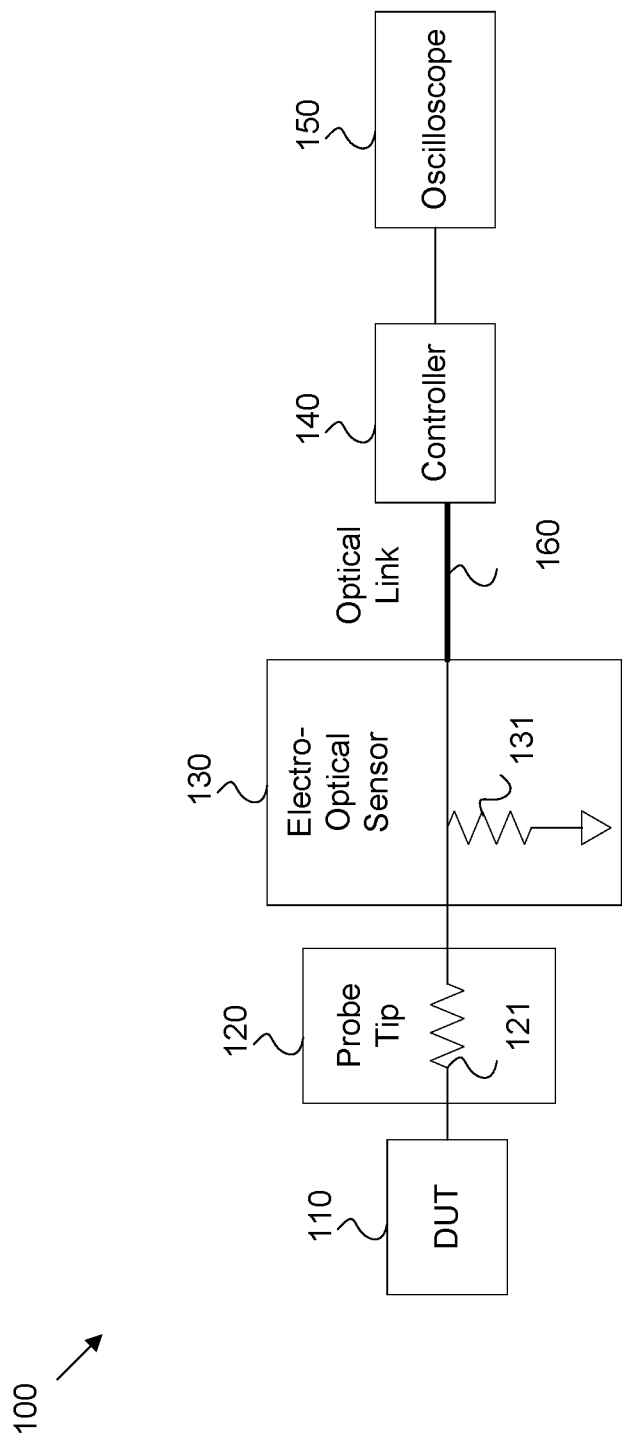
FIG. 1 is a schematic diagram of an example a test and measurement system employing optical isolation.

Optical voltage sensors have superior Alternating Current (AC) electrical performance and are inherently electrically isolated. Such systems may be used to couple digital signals into the vast fiber optic networks. These signals may be AC coupled and electrically transmitted in a controlled 50 ohm environment to achieve high bandwidths. Using these optical voltage sensors may involve using an RF input that constrains the input impedance. Driving a bias input of a modulator using a split path approach, as discussed below, overcomes limitations of a low impedance/low voltage environment and provides a higher input impedance and voltages as desired by the user. For example, the ability to accurately measure differential high bandwidth signals in the presence of large common mode voltages may be a measurement challenge as edge speeds increase for faster higher power DUTs. Wide bandgap devices based on Gallium Nitride (GaN) and Silicon Carbide (SiC) based DUTs may achieve edge speed 8-10 times faster than was possible with Silicon (Si) based devices. Given this step function in DUT performance gains, test and measurement systems should be modified to manage the expanded set of measurement challenges provided by such DUTs. Electrically isolated optical sensors provides for increased Common Mode Rejection Ratio (CMRR) performance. Such electrically isolated optical sensors may provide additional utility with higher input differential voltage ranges and higher input impedance. To achieve the higher input impedance and higher voltage ranges, this disclosure employs a communication scheme that leverages a MZM configuration on a limited power budget Disclosed herein is an electro-optical sensor configured with an increased impedance without significantly negatively impacting the power budget of the electro-optical sensor. The electro-optical sensor modulates a test signal onto an optical carrier via a MZM. The MZM may include a bias input and an RF input. The bias input has a significantly higher input impedance than the RF input. Hence, the test signal is coupled to the bias input to reduce the signal loading by raising the input impedance of the MZM circuit, without the additional power required by a high impedance, high bandwidth buffer/amplifier to drive the low impedance RF input. The RF input may not be used and/or may be omitted from the MZM. The increased impedance allows the MZM to act as a portion of a voltage divider circuit, which in turn allows a wide variety of high impedance probe tips to be employed by the electro-optical sensor. The electro-optical sensor also employs a split path buffer. The split path buffer employs an Alternating Current (AC) path for high frequency signals and a Direct Current (DC) path for low frequency and DC signals. The DC path may include a coupling switch, which can disconnect the DC path based on user input. This allows the DC component of a signal to be removed allowing only the AC component of the test signal to be measured. The DC path may include a DC offset circuit that provides the capability to move the input linear dynamic range around large fixed DC offsets on the signal under test Both, AC coupling and input DC offset capabilities allow a user to look at smaller AC component signals riding on top of a larger DC component of the test signal at the DUT. The DC offset circuit may also include an adjustable amplifier, which can be employed to match the gain of the DC path to the gain of the AC path.

FIG. 1 is a schematic diagram of an example a test and measurement system 100 employing optical isolation between a DUT 110 and an oscilloscope 150 and associated electric fields. The system 100 includes a probe tip 120 coupling a DUT 110 to an electro-optical sensor 130. Test signals from the DUT 110 are forwarded over the probe tip 120 to the electro-optical sensor 130 for conversion from an electrical signal into an optical signal. The optical signal is forwarded over an optical link 160 to a controller 140 for conversion back into an electrical signal. The converted signal is then forwarded to the oscilloscope 150 for testing. The conversion of the test signal from an electrical domain into an optical domain and back ensures that electrical coupling does not occur between the controller 140 and the electro-optical sensor 130. This test setup ensure electrical isolation between the DUT 110, probe tip 120, and electro-optical sensor 130 in a first electrical domain and the oscilloscope 150 and controller 140 in a second electrical domain.

The DUT 110 is any device configured to transmit an electrical signal for testing purposes. For example, the DUT 110 may contain internal circuitry, transmitters, receivers, etc. that a user may desire to test to verify appropriate functionality. The probe tip 120 is any testing accessory designed to couple to the DUT 110 for testing purposes. The probe tip 120 includes a signal channel to conduct the test signal from the DUT 110. It is desirable that the probe tip 120 not conduct voltage/current/charge from the DUT 110 for ideal measurement purposes. Conducting excess voltage/current/charge can change operating conditions at the DUT 110, and is known as signal loading. Signal loading may result in inaccurate measurements as the signal loading creates a potential for erroneous measurement results. The probe tip 120 may contain a series Resistance Capacitance (RC) network 121 to support reduced signal loading by providing some amount of electrical isolation between the DUT 110 from the probe tip 120. The RC network 121 supports a defined attenuation (e.g. ten times, one hundred times, etc.) Hence the probe tip 120 may be swapped out for other probe tips 120 to achieve different levels of attenuation as desired for a corresponding application. The probe tip 120 may be part of an active probe or a passive probe.

The electro-optical sensor 130 is any component configured to modulate an electrical test signal from the DUT 110 onto an optical carrier for transmission over an optical medium. The electro-optical sensor 130 may have a limited power budget available to power components. For example, the electro-optical sensor 130 may be battery powered due to unavailability of a power connection at the DUT 110 or a power connection may be omitted from the electro-optical sensor 130 to support electrical isolation for the DUT 110. The electro-optical sensor 130 may include a shunted RC network 131, where shunted indicates a coupling from a signal channel to a reference. The shunted RC network 131 operates in conjunction with the series RC network 121 to create a compensated voltage divider circuit. The resulting voltage divider circuit attenuates test signals over a broad range of frequencies. The attenuation of the voltage divider circuit is a ratio of the probe tip 120 series RC network 121 and the electro-optical sensor 130 shunted RC network 131. In order to mitigate signal loading when employed in conjunction with the series RC network 121, the shunted RC network 131 should employ a significant impedance. In other words, a low impedance value for the shunted RC network 131 requires a correspondingly low impedance value for the series RC network 121 in order to maintain a defined divide ratio and associated attenuation. When such values are low, the associated signal loading is high. As such, increasing the impedance of shunted RC network 131 allows for increased impedance at series RC network 121 and correspondingly reduced signal loading. The electro-optical sensor 130 should be configured to provide an increased impedance at the shunted RC network 131 while compensating for attendant test signal amplitude loss without employing high powered amplifiers that would employ an unacceptably high amount of the limited power budget. Specifically, an optical modulator in the electro-optical sensor 130 is part of the shunted RC network 131. The optical modulator outputs an optical signal over the optical link 160 (e.g. a fiber optic cable), and hence does not require additional electrical amplification. An example mechanism for using the optical modulator to provide impedance as discussed below.

The controller 140 may be any device configured to transmit an optical carrier, receive a corresponding optical signal 167, and forward transmission data from the optical signal to the oscilloscope for analysis and/or display to a user. As discussed in more detail below, the controller 140 provides an optical carrier to the electro-optical sensor 130 so that the electro-optical sensor 130 is not required to use power budget on optical carrier generation. The electro-optical sensor 130 the modulates the electrical signal onto the optical carrier, resulting in an optical signal. The controller 140 receives the optical signal and coverts it back to an electrical signal. The controller 140 may also control the electro-optical sensor 130 by optical signaling. As such, the optical link 160 acts as an electrical isolation barrier.

The oscilloscope 150 may be any device configured to measure a test signal from the controller 140. The oscilloscope 150 may then store such data and/or generate a waveform for display to a user via a graticule.

Figure 2:
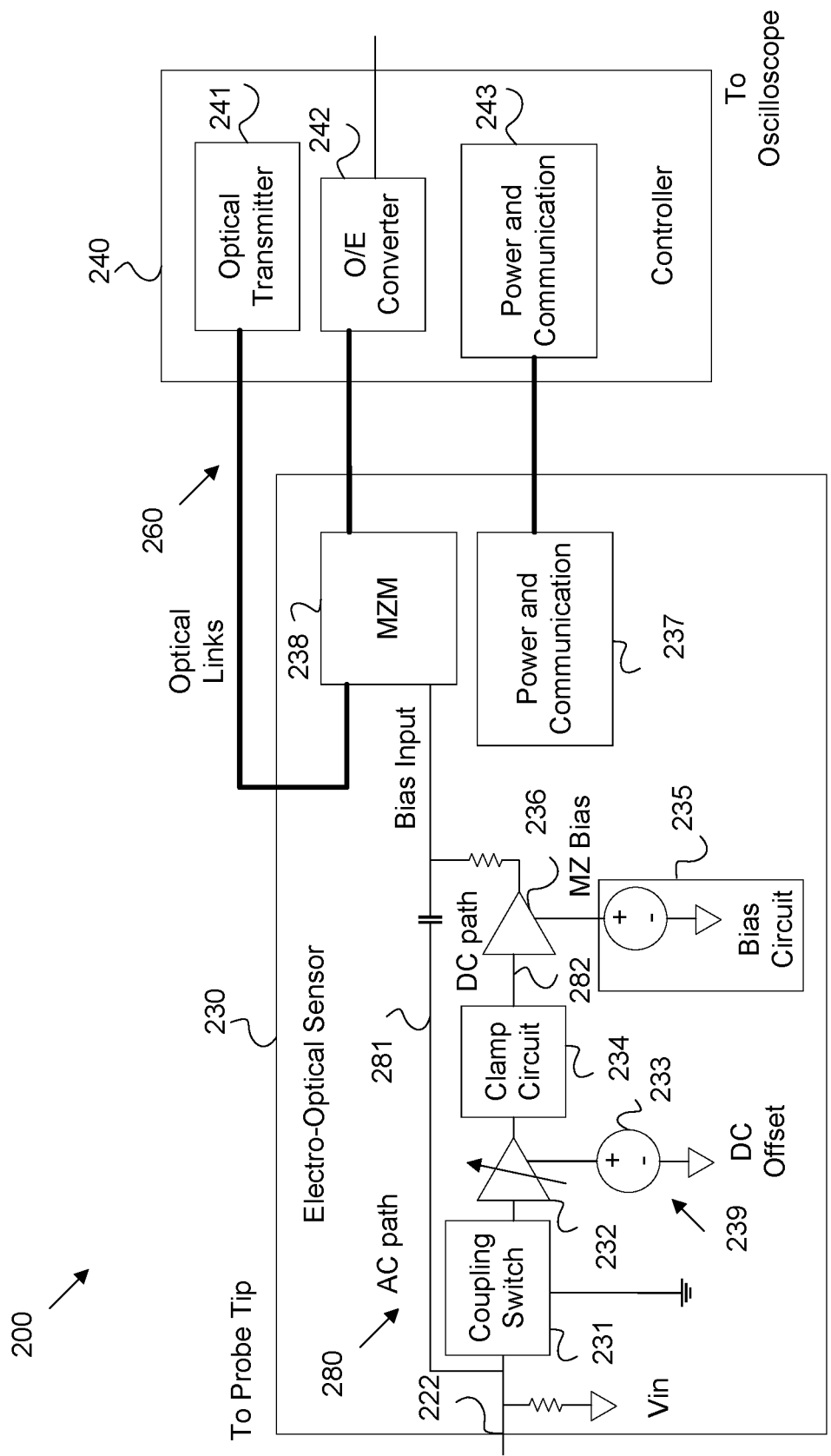
FIG. 2 is a schematic diagram of an example electro-optical sensor network with increased impedance for use in an optical isolation test and measurement system.

FIG. 2 is a schematic diagram of an example electro-optical sensor network 200 with increased impedance for use in an optical isolation test and measurement system. The network 200 may be employed to implement a corresponding portion of system 100. The network 200 includes an electro-optical sensor 230, optical links 260, and controller 240, which may implement the electro-optical sensor 130, optical links 160, and controller 140, respectively. The electro-optical sensor 230 includes a test signal input 222. The test signal input 222 may be any electrical connection for receiving a test signal from a DUT, for example via a probe tip such as probe tip 120. The electro-optical sensor 230 also includes a split path buffer 280 and an MZM 238. The test signal input 222 and split path buffer 280 form a signal channel for conducting a test signal from a DUT/test probe to the MZM 238 for modulation into an optical signal.

The split path buffer 280 includes an AC path 281 and a Direct Current (DC) path 282. The split path buffer 280 couples the test signal and a bias signal to a bias input of the MZM 238. The AC path 281 is configured to conduct AC portions of a test signal. For example, the AC path 281 includes one or more capacitors that block DC signal portions while allowing the AC portions of the test signal to pass. The DC path 282 is configured to conduct DC portions of the test signal. The DC path 282 includes various resistive components that propagate and/or amplify the DC signal.

The DC path 282 may include a coupling switch 231. The coupling switch 231 is user controlled, and may selectively remove DC voltage from the test signal based on user input. Specifically, the coupling switch 231 includes an input coupled to the test signal input 222 via the DC path 282. The coupling switch 231 also includes a first output coupled to a bias input of the MZM 238 via the DC path 282. When the coupling switch 231 is switched by the user to couple the test signal input 222 to the DC path 282, the DC portion of the test signal is forwarded toward the MZM 238. When the coupling switch 231 is switched by the user to disconnect the test signal input 222 from the DC portion of the test signal, the DC component is removed from the signal. In other words, the user may manipulate the coupling switch 231 to cause the test signal to either contain the AC and DC components of the test signal or just the AC component by blocking the DC component. This may be useful to emphasize small AC voltage variations (e.g. on the order of a volt or less) on a high DC voltage (e.g. a 500 volt test signal). Accordingly, the coupling switch 231 may remove the DC offset so the shape of the AC portion of the test signal is not obscured by the DC portion of the test signal.

The DC path 282 may also include a DC offset circuit 239. The DC offset circuit 239 may include an adjustable offset source 233, coupled to an adjustable amplifier 232 positioned along the DC path 282 as shown. In other words, the adjustable amplifier 232 includes an input coupled to the test signal input 222 via the DC path 282 and an output coupled to the bias input of the MZM 238 via the DC path 282. The adjustable amplifier 232 has an offset source 233, and moves the DC offset of the electrical signal in the DC path 282. Hence, the DC offset circuit 239 is configured to adjust the DC offset of the test signal based on user input. For example, the DC offset circuit 239 may be controllable by a user to provide an adjustment to the DC portion of the test signal of between zero volts and twenty five volts. When the test signal is coupled across the DC path 282 (e.g. the coupling switch 231 connected to the DC path 282) the DC offset of the test signal is increased by the amount specified by the user. When the DC component of test signal is disconnected by the coupling switch 231, the DC offset circuit 239 sets the DC offset of the test signal to the amount specified by the user. This allows the user to select a specified DC offset value other than zero and regardless of the base DC voltage of the test signal at the DUT. The adjustable amplifier 232 may also be employed during calibration to match a gain of the DC portion of the test signal with a gain of an AC portion of the test signal.

The DC path 282 may also include a clamp circuit 234. A clamp circuit 234 is an electronic circuit that fixes a positive and/or negative peak of a signal to a defined value. The clamp circuit 234 employs an upper bound and a lower bound outside the linear operating region. This provides the appearance of linear operation so the non-linear nature of the probe's response does not alter the test signal test signal (e.g. by appearing as part of the test signal).

The DC path 282 includes a bias circuit 235 to generates a bias signal. The bias signal controls the operating mode of the MZM 238, for example by setting the MZM 238 to operate at a quadrature point, a null point, and/or a maximum point. In some examples, the bias circuit 235 includes a photodetector positioned on the output of the MZM. The photodetector measures the optical output of the MZM 238, and the bias circuit 235 generates/adjusts the bias signal to adjust the electrical characteristics of the MZM 238 in order to maintain a specified operation point. Hence, the bias circuit 235 is any circuit capable of altering the electrical characteristics of the MZM 238 to adjust the modulation of the test signal onto an optical carrier 161, for example to control for error. The bias circuit 235 may be coupled to an amplifier 236 positioned along the DC path 282. As such, the amplifier 236 DC offset moves the test signal by a value corresponding to the bias signal. In other words, the amplifier 236 of the split path buffer 280 serves as a mechanism for combining the bias signal and the test signal for reasons discussed below.

The MZM 238 is an electro-optical component capable of modulating a phase and/or an intensity of an optical carrier according to a received electrical signal. A MZM 238 may include a bias input and an RF input. In most MZMs, the bias input is employed to receive the bias signal and maintain control the operating point of the MZM, while the RF input is employed to alter the electrical characteristics applied to an optical waveguide to modulate the optical carrier into an optical signal. For MZM 238 as shown, the RF input is not used and may be omitted completely in some examples. The MZM 238 bias input is coupled to the test signal input 222 and the bias circuit 235 via the split path buffer 280. The MZM 238 is configured to receive both the test signal and the bias signal on the bias input. The MZM 238 also receives an optical carrier signal via an optical input. As waveforms can be added together without interference by the amplifier 236, the MZM 238 operates in an operating mode selected/maintained by the bias signal while modulating the test signal from the bias input onto the optical carrier to generate an optical signal. In other words, the MZM 238 may receive a bias signal set to keep the modulator operating at a quadrature point with the test signal from the DUT combined with the bias signal, which then modulates the optical carrier. The MZM 238 may then output the resulting optical signal to the optical links 160 via an optical output. The bias input has a higher input impedance than the RF input. The bias input of the MZM 238 acts as shunted RC network 131 in a voltage divider circuit. As such, coupling the test signal to the bias input allows for a wide range of probe tips to be employed in conjunction with the electro-optical sensor head while minimizing the signal loading on the DUT. Further, the output of the MZM 238 is optical and hence does not need additional electrical amplification. Accordingly, the MZM 238 has a high impedance input without requiring additional amplifiers, which would further drain the limited power budget of the electro-optical sensor 130. In one example, applying the test signal and bias signal to the MZM 238 bias input allows the electro-optical conversion process to operate at less than 12 milliwatts (MW) of power.

The above mentioned scheme provides several benefits. For example, the electro-optical sensor 230 may increase the user input offset range by about ten times over other example electro-optical isolation systems. This scheme also allows the electro-optical sensor 230 to reject the DC component of the test signal. As a specific example, the electro-optical sensor 230 may provide a one megaohm (Mohm)/twenty picofarad (pF) test signal input 222 connection, which provides a remote oscilloscope-like front end from the perspective of the DUT. This allows high input impedance passive probes to be connected to the test signal input 222 and to extend the input voltage range in excess of 1 kilovolt (kV) in some examples.

The electro-optical sensor 230 is controlled by the controller 240. The controller 240 may be any device configured to transmit an optical carrier, receive a corresponding optical signal, and forward transmission data from the optical signal to an oscilloscope or other test and measurement device for analysis and/or display to a user. The controller 240 includes an optical transmitter 241 coupled to an optical output port. The optical transmitter 241 may be any device configured to generate an optical carrier. For example, the optical transmitter 241 may be a laser/laser diode that emits polarized light. The optical output is any port capable of coupling an optical link, such as an optical fiber, to the optical transmitter 241 to support communication of the optical carrier from the controller 240 to the electro-optical sensor 230. By forwarding the optical carrier to the electro-optical sensor 230 for modulation, the burden of powering the optical transmitter 241 is handled by the controller 240 and not applied to the electro-optical sensor's 230 power budget. The controller 240 also includes an optical input ports configured to forward the optical signal from the MZM 238 to an optical to electrical (O/E) converter 242. The O/E converter 242 is any device configured to convert an optical signal into an electrical signal, for example by employing photodiodes. As such, the O/E converter 242 converts the optical signal into the electrical domain for communication to an oscilloscope.

The electro-optical sensor 230 includes a power and communication module 237. The controller 240 also includes a corresponding power and communication module 243. The power and communication modules 237 and 243 are coupled by one or more additional optical links 260. The power and communication module 243 controls the power and communication module 237 via the optical link 260. Further, in some examples, the power and communication modules 243 forwards an optical signal of sufficient strength to provide power to a photo-receptor at the power and communication module 237. This may be employed to provide some or all of the power needed by the electro-optical sensor 230. In other examples, the power and communication module 237 may include batteries or other power sources instead of/in addition to the photo-receptors. The communication between the power and communication modules 237 and 243 is performed in the optical domain to support electrical isolation of the electro-optical sensor 230.

Figure 3:
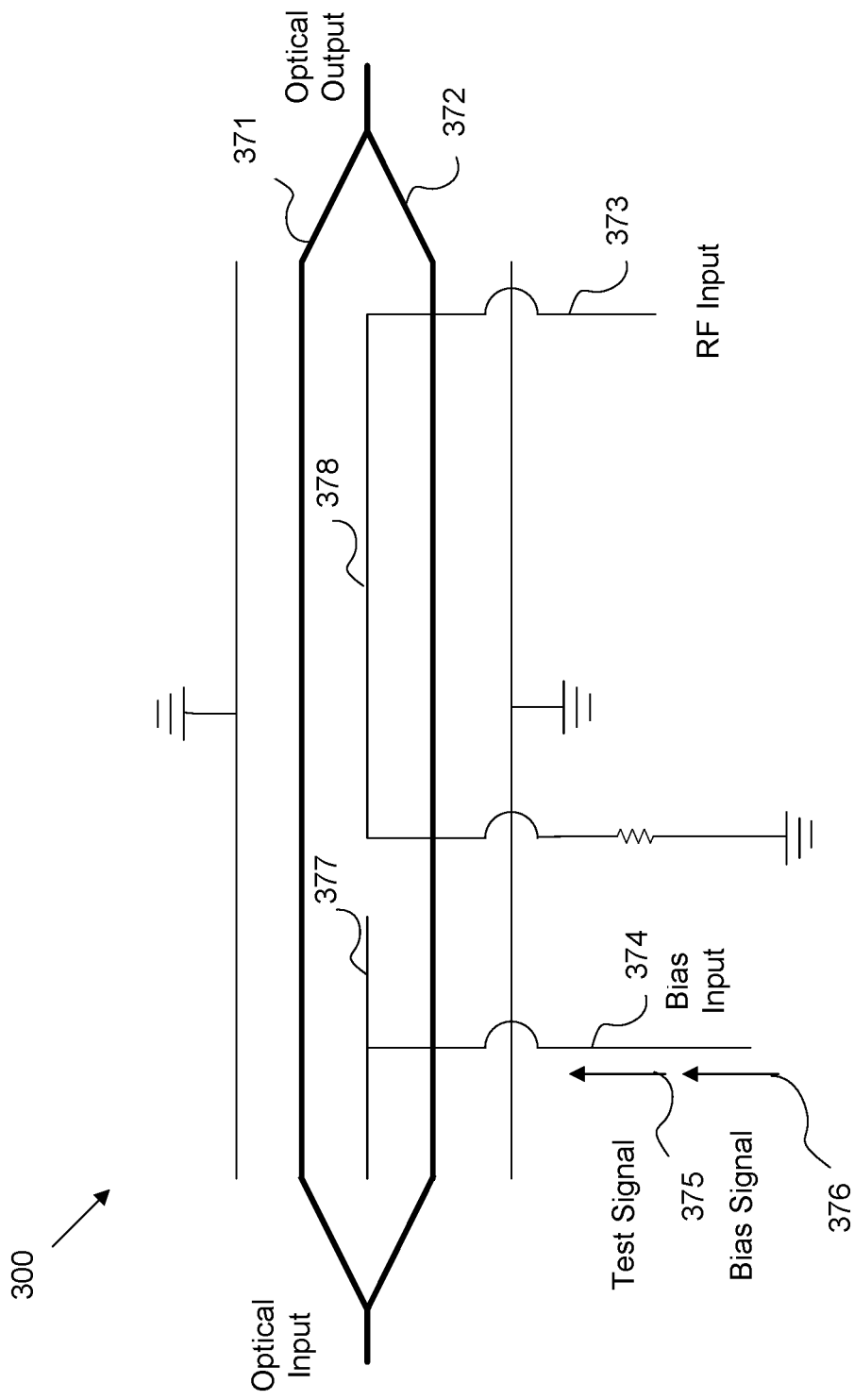
FIG. 3 is a schematic diagram of an example Mach-Zehnder Modulator (MZM) configured to receive a test signal over a bias input without employing a Radio Frequency (RF) input.

FIG. 3 is a schematic diagram of an example MZM 300 configured to receive a test signal over a bias input 374 without employing an RF input 373. For example, the MZM 300 may be employed to implement an MZM 238. The MZM 300 may also be implemented as a Mach-Zehnder interferometer in some examples. The MZM 300 includes an upper arm 371 and a lower arm 372, which are waveguides configured to conduct light. Light from an optical source (e.g. an optical carrier) is split between the upper arm 371 and the lower arm 372. The MZM 300 receives a test signal 375 and a bias signal 376 from a DUT and a bias circuit, respectively, via a split path buffer. The electrical fields from the test signal 375 and the bias signal 376 change the electrical characteristics of the MZM 300, causing the MZM 300 to alter the phase of light passing through the upper arm 371 and lower arm 372. Accordingly, the test signal 375 from the DUT causes changes in the light in the optical carrier resulting in an optical signal. Further, the bias signal 376 can modify the operating mode/operating point of the MZM 300, for example to correct for errors. The resulting light in the upper arm 371 and the lower arm 372 is recombined as a modulated optical signal.

It should be noted that MZM 300 is not drawn to scale. It should also be noted that the bias input 374 is coupled to conductor 377 between the MZM arms 371 and 372. The conductor 377 coupled to the bias input 374 is shorter than the conductor 378 coupled to an RF input 373. Further, the conductor 377 coupled to the bias input 374 may include a single connection instead of a pair of connections at the conductor 378. As such, the conductor 377 of the bias input 374 acts like capacitor from an electrical standpoint, while the conductor 378 acts as a transmission line. The conductor 377, on the bias input 374, is an open stub with a large input impedance compared to the conductor 378 on the RF input 373. Hence, forwarding the test signal 375 and bias signal 376 into the bias input 374 results in a much higher input impedance then using the RF input 373. The RF input 373 and the conductor 378 may not be used. As such, the MZM 300 includes an RF input 373 that is not configured to receive the test signal.

Figure 4:
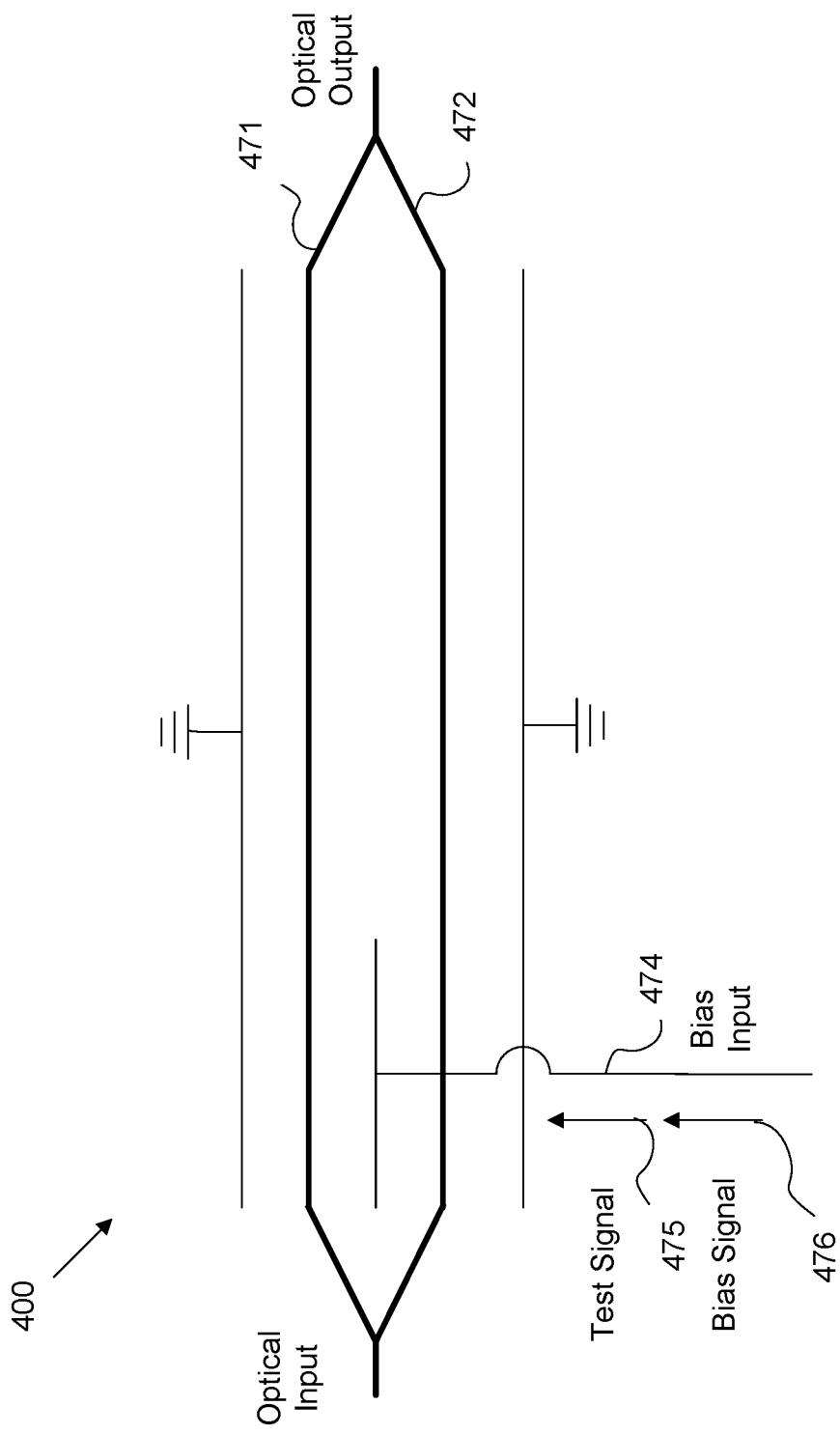
FIG. 4 is a schematic diagram of an example MZM configured to receive a test signal over a bias input and omit the RF input.

FIG. 4 is a schematic diagram of a MZM 400 configured to receive a test signal over a bias input 474 and omit the RF input. For example, the MZM 400 may be employed to implement an MZM 238. The MZM 400 may also be implemented as a Mach-Zehnder interferometer in some examples. The MZM 400 includes an upper arm 471, a lower arm 472, and a bias input 474 that receives a combined test signal 475 and bias signal 476, which may be substantially similar to the upper arm 371, the lower arm 372, the bias input 374, the test signal 375, and the bias signal 376, respectively. As shown, the MZM 400 does not include an RF input. However, the MZM 400 operates at a selected operating mode/point and modulates the test signal 475 onto an optical carrier without the RF input.

Figure 5:
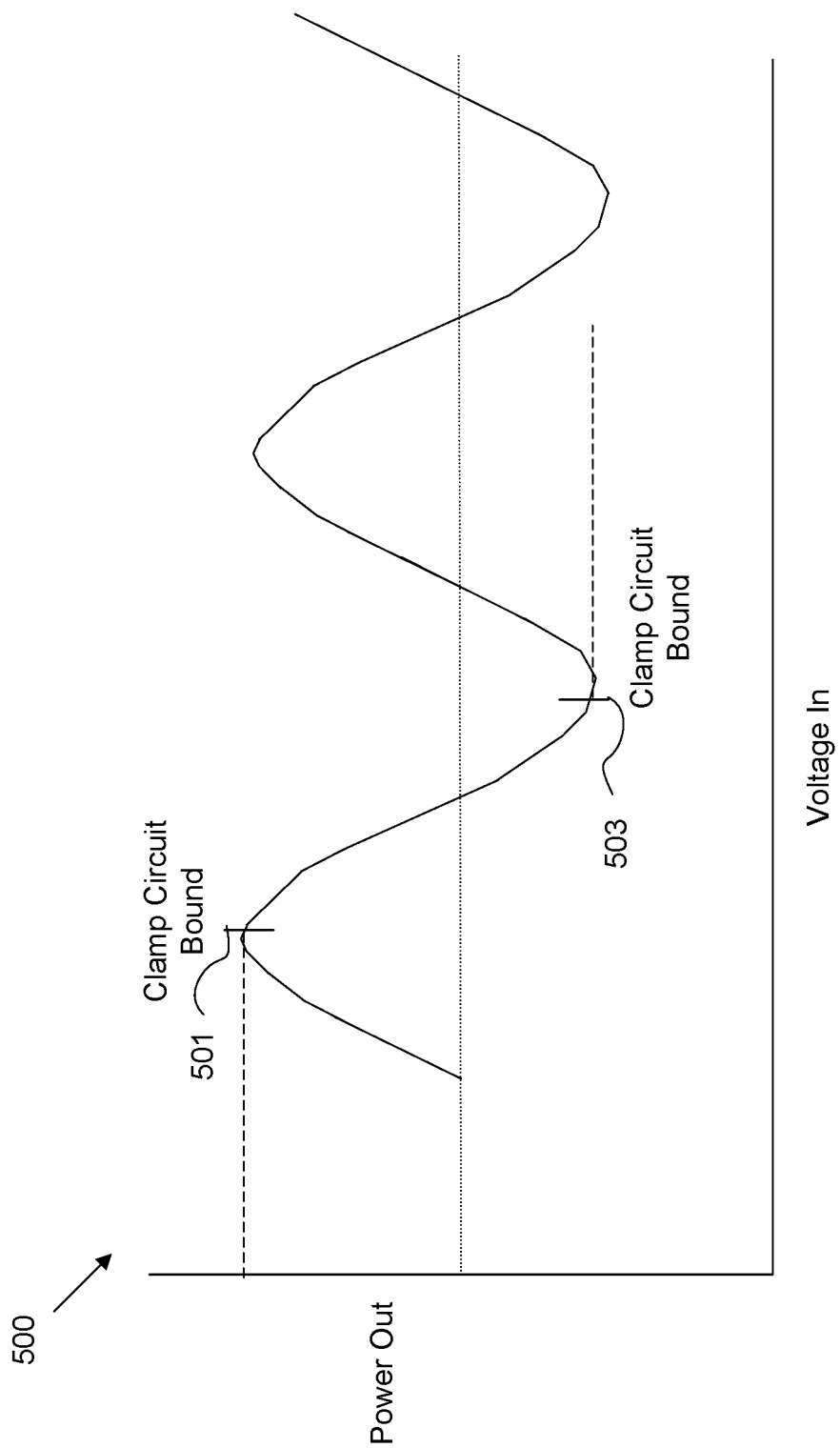
FIG. 5 is a graph illustrating the electrical effects of an example clamp circuit in a split path buffer.

FIG. 5 is a graph 500 illustrating the electrical effects of an example clamp circuit, such as a clamp circuit 234 in a split path buffer. Graph 500 depicts the change in output power of the split path buffer as a function of the applied voltage. As can be seen by the solid line, the power to voltage relationship oscillates in a sign wave pattern. Such non-linear changes can be misinterpreted by the user. Hence the clamp circuit maintains a lower voltage clamp circuit bound 501 and an upper voltage clamp circuit bound 503. As shown by the dashed line, the clamp circuit maintains the power at a constant high value when the voltage is below the lower voltage clamp circuit bound 501 and at a constant low value when the voltage is above the upper voltage clamp circuit bound 503. This causes the split path buffer to operate in a monotonic, single-valued fashion.

Figure 6:
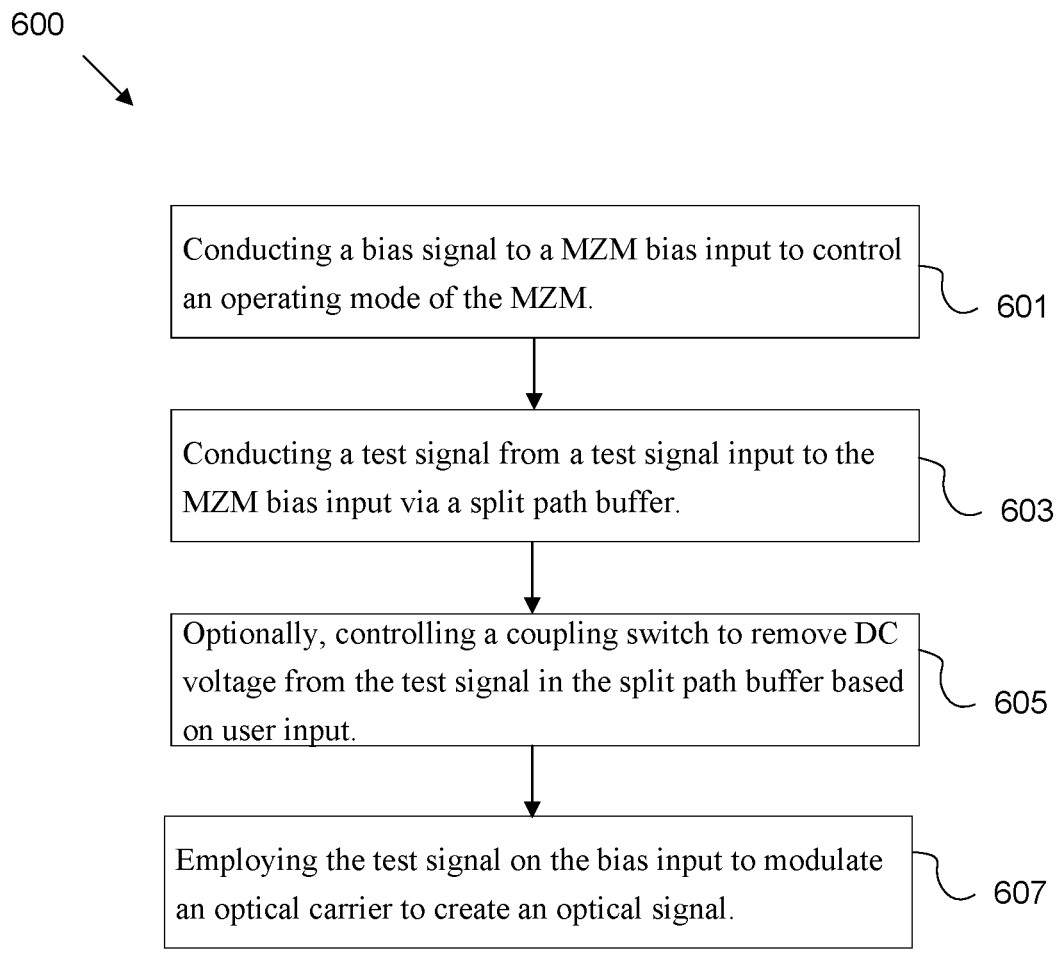
FIG. 6 is a flowchart of an example method to increase electro-optical sensor impedance by employing a MZM bias input to modulate an optical signal.

FIG. 6 is a flowchart of an example method 600 to increase electro-optical sensor impedance by employing a MZM bias input to modulate an optical signal. Method 600 may be implemented by employing a MZM 300 and/or 400 in an electro-optical sensor 230, which may implement a corresponding portion of a test and measurement system 100. At block 601, a bias signal is conducted to a MZM bias input to control an operating mode of the MZM. At block 603, a test signal from a test signal input is also conducted to the MZM bias input. The bias signal of block 601 and the test signal of block 603 may be combined and conducted to the MZM via a split path buffer as discussed above. Also as noted above, the MZM may not include a RF input or the RF input may be unused (e.g. left disconnected). Conducting the test signal to the bias input of the MZM may result in the MZM acting as a high impedance load in a voltage divider circuit.

At optional block 605, a coupling switch in the split path buffer may be controlled to remove DC voltage from the test signal in the split path buffer based on user input. Further, a DC offset circuit may be controlled to adjust the DC portion of the test signal in the split path buffer based on user input. As discussed above, employing both the coupling switch and the DC offset circuit may allow a user to view small AC signals on top of large DC signals at the DUT. Further, at block 607, the test signal on the bias input is employed to modulate an optical carrier to create an optical signal for transmission to a test and measurement device, such as an oscilloscope.

Examples of the disclosure may operate in conjunction with a particularly created hardware, firmware, digital signal processors, or a specially programmed computer including a processor operating according to programmed instructions. The terms "controller" or "processor" as used herein are intended to include microprocessors, microcomputers, ASICs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer-readable storage medium such as a hard disk, optical disk, removable storage media, solid state memory, RAM, etc. As will be appreciated by one of skill in the art, the functionality of the program modules may be combined or distributed as desired in various examples. In addition, the functionality may be embodied in whole or in part in firmware or hardware equivalents such as integrated circuits, field programmable gate arrays (FPGA), and the like. Particular data structures may be used to more effectively implement one or more aspects of the disclosure, and such data structures are contemplated within the scope of computer executable instructions and computer-usable data described herein.

Aspects of the present disclosure operate with various modifications and in alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific examples described herein unless expressly limited. As such, the present disclosure is intended to cover all modifications, equivalents, and alternatives of the described aspects in light of the attached drawings and claims.

References in the specification to embodiment, aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include Random Access Memory (RAM), Read Only Memory (ROM), Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples

Illustrative examples of the technologies disclosed herein are provided below. An embodiment of the technologies may include any one or more, and any combination of, the examples described below.

Example 1 includes an electro-optical sensor comprising: a test signal input to receive a test signal from a device under test (DUT); a bias circuit to generate a bias signal; a Mach-Zehnder Modulator (MZM) including an optical input, an optical output, and a bias input, the MZM configured to: receive an optical carrier signal via the optical input; receive both the test signal and the bias signal on the bias input; modulate the test signal from the bias input onto the optical carrier to generate an optical signal while operating in a mode selected by the bias signal; and output the optical signal over the optical output.

Example 2 includes the electro-optical sensor of Example 1, wherein the MZM does not include a Radio Frequency (RF) input.

Example 3 includes the electro-optical sensor of any of Examples 1-2, wherein the MZM includes an RF input that is not configured to receive the test signal.

Example 4 includes the electro-optical sensor of any of Examples 1-3, wherein receiving the test signal at the bias input results in the MZM acting as a high impedance load in a voltage divider circuit.

Example 5 includes the electro-optical sensor of any of Examples 1-4, including a split path buffer coupling the test signal and the bias signal to the MZM bias input, the split path buffer including an Alternating Current (AC) path and a Direct Current (DC) path.

Example 6 includes the electro-optical sensor of Example 5, wherein the DC path includes a coupling switch to remove DC voltage from the test signal based on user input.

Example 7 includes the electro-optical sensor of any of Examples 5-6, wherein the DC path includes a DC offset circuit to adjust a DC portion of the test signal based on user input.

Example 8 includes the electro-optical sensor of Example 7, wherein the DC offset circuit is controllable to provide an adjustment to the DC portion of the test signal between zero volts and twenty five volts.

Example 9 includes the electro-optical sensor of any of Examples 7-8, wherein the DC offset circuit includes an adjustable amplifier to match a gain of the DC portion of the test signal with a gain of an AC portion of the test signal.

Example 10 includes an electro-optical sensor comprising: a test signal input; a split path buffer including an Alternating Current (AC) path and a Direct Current (DC) path, the AC path and the DC path coupled to the test signal input; and a Mach-Zehnder Modulator (MZM) including a bias input coupled to the test signal input and a bias circuit via the split path buffer.

Example 11 includes the electro-optical sensor of Example 10, wherein the MZM does not include a Radio Frequency (RF) input.

Example 12 includes the electro-optical sensor of any of Examples 10-11, wherein the MZM includes an RF input that is not coupled to the test signal input.

Example 13 includes the electro-optical sensor of any of Examples 10-12, wherein the DC path includes a coupling switch with an input coupled to the test signal input via the DC path, a first output coupled to the bias input of the MZM via the DC path, and a second output to remove a DC signal from a test signal traversing the DC path.

Example 14 includes the electro-optical sensor of any of Examples 10-13, wherein the DC path includes a DC offset circuit including an adjustable amplifier with an input coupled to the test signal input via the DC path and an output coupled to the bias input of the MZM via the DC path.

Example 15 includes the electro-optical sensor of Example 14, wherein the DC offset circuit includes an adjustable DC source coupled to the adjustable amplifier.

Example 16 includes a method comprising: conducting a bias signal to a Mach-Zehnder Modulator (MZM) bias input to control an operating mode of the MZM; conducting a test signal from a test signal input to the MZM bias input via a split path buffer; and employing the test signal on the bias input to modulate an optical carrier to create an optical signal.

Example 17 includes the method of Example 16, wherein the MZM does not include a Radio Frequency (RF) input or the RF input is unused.

Example 18 includes the method of any of Examples 16-17, wherein conducting the test signal to the bias input of the MZM results in the MZM acting as a high impedance load in a voltage divider circuit.

Example 19 includes the method of any of Examples 16-18, further comprising controlling a coupling switch to remove DC voltage from the test signal in the split path buffer based on user input.

Example 20 includes the method of any of Examples 16-19, further comprising controlling a Direct Current (DC) offset circuit to adjust a DC portion of the test signal in the split path buffer based on user input.

The previously described examples of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. An electro-optical sensor comprising:
a test signal input to receive a test signal from a device under test (DUT);
a bias circuit to generate a bias signal;
a Mach-Zehnder Modulator (MZM) including an optical input, an optical output, and a bias input, the MZM configured to:
receive an optical carrier signal via the optical input;
receive both the test signal and the bias signal on the bias input;
modulate the test signal from the bias input onto the optical carrier signal to generate an optical signal while operating in a mode selected by the bias signal; and
output the optical signal over the optical output,
wherein receiving the test signal at the bias input results in the MZM acting as a high impedance load in a voltage divider circuit to reduce signal loading on the test signal.

2. The electro-optical sensor of claim 1, wherein the MZM does not include a Radio Frequency (RF) input.

3. The electro-optical sensor of claim 1, wherein the MZM includes an RF input that is not configured to receive the test signal.

4. The electro-optical sensor of claim 1, including a split path buffer coupling the test signal and the bias signal to the MZM bias input, the split path buffer including an Alternating Current (AC) path and a Direct Current (DC) path.

5. The electro-optical sensor of claim 4, wherein the DC path includes a coupling switch to remove DC voltage from the test signal based on user input.

6. The electro-optical sensor of claim 4, wherein the DC path includes a DC offset circuit to adjust a DC portion of the test signal based on user input.

7. The electro-optical sensor of claim 6, wherein the DC offset circuit is controllable to provide an adjustment to the DC portion of the test signal between zero volts and twenty five volts.

8. The electro-optical sensor of claim 6, wherein the DC offset circuit includes an adjustable amplifier to match a gain of the DC portion of the test signal with a gain of an AC portion of the test signal.

9. An electro-optical sensor comprising:
a test signal input for receiving a test signal from a device under test;
a split path buffer including an Alternating Current (AC) path and a Direct Current (DC) path, the AC path and the DC path coupled to the test signal input; and
a Mach-Zehnder Modulator (MZM) including a bias input coupled to the test signal input and a bias circuit via the split path buffer,
wherein coupling the test signal input to the bias input results in the MZM acting as a high impedance load in a voltage divider circuit to reduce signal loading on the test signal.

10. The electro-optical sensor of claim 9, wherein the MZM does not include a Radio Frequency (RF) input.

11. The electro-optical sensor of claim 9, wherein the MZM includes an RF input that is not coupled to the test signal input.

12. The electro-optical sensor of claim 9, wherein the DC path includes a coupling switch with an input coupled to the test signal input via the DC path, a first output coupled to the bias input of the MZM via the DC path, and a second output to remove a DC signal from a test signal traversing the DC path.

13. The electro-optical sensor of claim 9, wherein the DC path includes a DC offset circuit including an adjustable amplifier with an input coupled to the test signal input via the DC path and an output coupled to the bias input of the MZM via the DC path.

14. The electro-optical sensor of claim 13, wherein the DC offset circuit includes an adjustable DC source coupled to the adjustable amplifier.

15. A method comprising:
   conducting a bias signal to a Mach-Zehnder Modulator (MZM) bias input to control an operating mode of the MZM;
   conducting a test signal from a test signal input to the MZM bias input via a split path buffer; and
   employing the test signal on the bias input to modulate an optical carrier to create an optical signal,
   wherein conducting the test signal to the bias input of the MZM results in the MZM acting as a high impedance load in a voltage divider circuit to reduce signal loading on the test signal.

16. The method of claim 15, wherein the MZM does not include a Radio Frequency (RF) input or the RF input is unused.

17. The method of claim 15, further comprising controlling a coupling switch to remove DC voltage from the test signal in the split path buffer based on user input.

18. The method of claim 15, further comprising controlling a Direct Current (DC) offset circuit to adjust a DC portion of the test signal in the split path buffer based on user input.

* * * * *